United States Patent
Strnad

(12)
(10) Patent No.: US 6,338,974 B1
(45) Date of Patent: Jan. 15, 2002

(54) INTEGRATED CIRCUIT ANALYTICAL IMAGING TECHNIQUE EMPLOYING A BACKSIDE SURFACE FILL LAYER

(75) Inventor: Richard J. Strnad, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/629,767

(22) Filed: Jul. 31, 2000

(51) Int. Cl.$^7$ .......................... H01L 21/66; G01R 31/26
(52) U.S. Cl. .......................... 438/16; 438/114
(58) Field of Search .......................... 438/14, 16, 17, 438/57, 66, 68, 72, 108, 4, 110, 113, 114, 122

(56) References Cited

U.S. PATENT DOCUMENTS

| | | | |
|---|---|---|---|
| 4,891,334 A | * 1/1990 | Satoh et al. | 438/228 |
| 5,952,045 A | * 9/1999 | Bossart | 427/240 |
| 6,008,070 A | * 12/1999 | Farnworth | 438/114 |
| 6,107,107 A | * 8/2000 | Bruce et al. | 438/14 |
| 6,117,695 A | * 9/2000 | Murphy et al. | 438/15 |
| 6,168,965 B1 | * 1/2001 | Malinovich et al. | 438/66 |
| 6,175,160 B1 | * 1/2001 | Paniccia et al. | 257/778 |

OTHER PUBLICATIONS

Gary Shade et al., *Photoemission Microscopy*, in Microelectronic Failure Analysis: Desk Reference, 181–196 (Thomas W. Lee et al. eds., Asm Intl. 1993).

Edward I. Cole Jr. et al., *Failure Site Isolation: Photon Emission Microscopy Optical/Electron Beam Techniques*, in Failure Analysis of Integrated Circuits: Tools and Techniques, (Lawrence C. Wager eds., Kluwer Academic Publishing 1999).

Ching–Lang Chiang and Daniel T. Hurley, *Dynamics of Backside Wafer Level Microprobing*, 1998 IEEE International Reliability Physics Symposium Proceedings. 36th Annual, 137–149 (1998).

Ching–Lang Chiang, Neeraj Khurana and Daniel T. Hurley, *Backside Emission Microscopy for Integrated Circuits on Heavily Doped Substrate*, Proceedings from the 24th International Symposium for Testing and Failure Analysis (Nov. 15–19, 1998).

Christian Boit, *Photoemission Microscopy–Advanced/Theory of Operation*, 213–229.

\* cited by examiner

*Primary Examiner*—David Nelms
*Assistant Examiner*—Phuc T. Dang
(74) *Attorney, Agent, or Firm*—Stallman & Pollock LLP

(57) ABSTRACT

An integrated circuit (IC) analytical imaging process that does not require a mirror-like semiconductor substrate backside surface and that is simple, fast and inexpensive. The process includes steps of first providing a semiconductor device structure with a semiconductor substrate and an IC formed in and on the upper surface of the semiconductor substrate, followed by thinning of the semiconductor substrate by removing semiconductor material from its lower surface. This thinning step creates a thinned semiconductor substrate with a backside surface with a roughness due to the presence of peaks and valleys. A backside surface fill material (e.g., water, optical grade oil or optical grade epoxy) is then applied to the backside surface of the thinned semiconductor substrate. The application of the backside surface fill material creates a backside surface fill material layer that at least partially fills the valleys. An analytical imaging technique (e.g., photon emission microscopy or voltage contrast analysis) is subsequently performed by collecting radiation emitted through the backside surface. The presence of a backside surface fill material layer, which at least partially fills the valleys of the backside surface, improves the transmissivity and efficiency of radiation emission through the backside surface.

13 Claims, 2 Drawing Sheets

INTEGRATED CIRCUIT ANALYTICAL IMAGING TECHNIQUE EMPLOYING A BACKSIDE SURFACE FILL LAYER

BACKGROUND OF THE INVENTION

1. Field of the Invention

The present invention relates to integrated circuit analytical techniques and, in particular, to integrated circuit analytical imaging techniques.

2. Description of the Related Art

Integrated circuit (IC) analytical imaging techniques (e.g., photon emission microscopy techniques and voltage contrast analysis techniques) are commonly employed during failure analysis of semiconductor device structures. In such techniques, radiation (e.g., visible and/or near infra-red [IR] wavelength photons) emitted from an IC during the application of a test signal is collected and analyzed to form an image, from which information can be derived about the operation and/or failure mode of the IC. Further descriptions of IC analytical imaging techniques are available in E. I. Cole and D. L. Barton, *Failure Site Isolation: Photon Emission Microscopy Optical/Electron Beam Techniques*, in Failure Analysis of Integrated Circuits: Tools and Techniques, 87–112 (Kluwer Academic Publishing 1999) and Ching-Lang Chiang, et al., *Backside Emission Microscopy for Integrated Circuits on Heavily Doped Substrate*, Proceedings from the 24th International Symposium for Testing and Failure Analysis (15–19 November, 1998), both of which are hereby fully incorporated by reference.

FIG. 1 depicts, in cross-section, a conventional semiconductor device structure 10. Semiconductor device structure 10 includes a semiconductor substrate 12 (typically, 400 microns or more in thickness) with an IC (not shown) formed in and on the semiconductor substrate. The formation of an IC in and on the semiconductor substrate 12 typically entails the creation of both an active circuit layer 14 (e.g., a 10 micron thick epitaxial silicon layer) in the semiconductor substrate 12 and a metal interconnect layer 16 (e.g., a 4 micron thick metal interconnect layer) on the semiconductor substrate 12. Such a semiconductor device structure has an upper surface 18 and a lower surface 20.

Metal interconnect layer 16 includes opaque metal lines (not shown) that can block the emission of radiation from the upper surface 18 of the semiconductor device structure 10. In addition, it has become increasingly common to package semiconductor device structures using flip-chip packaging techniques that require the use of opaque solder bumps on the upper surface 18. The presence of opaque metal lines and solder bumps, however, makes it difficult to conduct IC analytical imaging techniques that involve the collection of radiation emitted from the upper surface of a semiconductor device structure. Consequently, IC analytical imaging techniques that involve the collection of radiation emitted from the lower surface (commonly referred to as "backside IC analytical imaging techniques") of a semiconductor device structure are gaining in popularity and importance. A drawback of such backside IC analytical imaging techniques, however, is that the semiconductor substrate (e.g., a silicon substrate) attenuates the radiation being emitted from the IC. This attenuation occurs since the semiconductor substrate acts as a band-pass filter.

To minimize attenuation of emitted radiation by the semiconductor substrate, the semiconductor substrate is commonly thinned via mechanically polishing prior to the collection of emitted radiation. FIG. 2 illustrates the semiconductor device structure 10 of FIG. 1 after the semiconductor substrate has been thinned via mechanical polishing to form a thinned semiconductor substrate 22. The thinned semiconductor substrate can have a thickness, for example, of 100 microns. The dashed lines indicate the boundaries of semiconductor substrate 12 prior to thinning. One effect of mechanical polishing, however, is the creation of a rough backside surface 24 that includes a plurality of peaks 26 and valleys 28. Such a rough backside surface 24 can scatter radiation (e.g., photons) being emitted from the IC, resulting in a degraded image. The scattering of radiation by the rough backside surface 24 can be minimized if a mirror-like backside surface is created during thinning of the semiconductor substrate. Producing such a mirror-like backside surface, however, requires complex, time-consuming and expensive techniques. For example, 10 hours of mechanical polishing can be required to decrease the roughness of a backside surface from 100 angstroms (peak-to-valley) to 50 angstroms (peak-to-valley).

Still needed in the field, therefore, is an IC analytical imaging technique that eliminates the need to produce a mirror-like backside surface. In addition, the IC analytical imaging technique should be relatively simple, fast and inexpensive.

SUMMARY OF THE INVENTION

The present invention provides an integrated circuit (IC) analytical imaging process that eliminates the need to produce a mirror-like backside surface. In addition, the process is simple, fast and inexpensive. Processes in accordance with the present invention include steps of first providing a semiconductor device structure. The semiconductor device structure includes a semiconductor substrate formed of a semiconductor material (e.g., a silicon substrate, GaAs substrate or other III–V compound substrate) and an IC. The IC is formed in and on the semiconductor substrate. Next, the semiconductor substrate is thinned by removing semiconductor material from the lower surface of the semiconductor substrate. This thinning creates a thinned semiconductor substrate that has a backside surface. The backside surface of the thinned semiconductor substrate has a roughness due to the presence of a plurality of peaks and valleys thereon. A backside surface fill material (e.g., water, optical grade oil or optical grade epoxy) is subsequently applied to the backside surface of the thinned semiconductor substrate. The application of the backside surface fill material creates a backside surface fill material layer, which at least partially fills the valleys.

After application of the backside surface fill material, an analytical imaging technique (e.g., photon emission microscopy techniques or voltage contrast analysis techniques) is performed by collecting radiation emitted through the backside surface.

Since the backside surface fill material layer at least partially fills the valleys of the backside surface, the transmissivity and efficiency of radiation emitted through the backside surface is improved due to a reduction in radiation scattering. In addition, processes in accordance with the present invention are lower in cost, simpler and less time consuming (i.e., faster) than conventional processes that create a mirror-like backside surface via mechanical polishing.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 1:
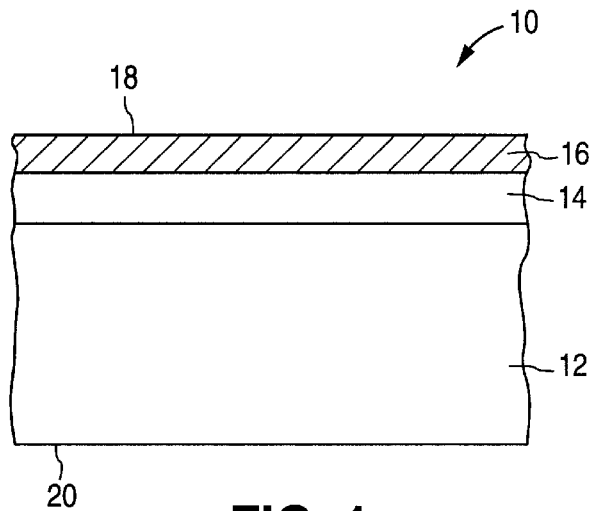
FIG. 1 depicts, in cross-section, a conventional semiconductor device structure.
Figure 2:
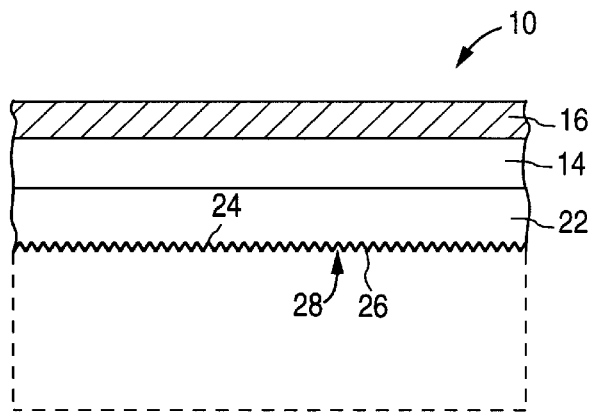
FIG. 2 depicts, in cross-section, the conventional semiconductor device structure of FIG. 1, after the semiconductor substrate has been thinned via mechanical polishing.
Figure 3:
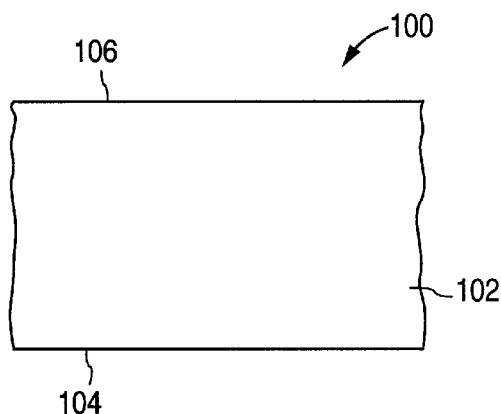
FIGS. 3–5 are cross-sectional views illustrating stages in a process according to the present invention.

FIGS. 3–6 illustrate various stages of a process in accordance with the present invention. First, a semiconductor device structure 100 is provided that includes a semiconductor substrate 102 (e.g., a silicon substrate, a gallium arsinide [GaAs] substrate or other III–V compound semiconductor substrate) formed of a semiconductor material. The semiconductor device structure 100 includes an IC (not shown) formed in and on the upper surface 104 of the semiconductor substrate 102, which also has a lower surface 106, as shown in FIG. 3. The thickness of the semiconductor substrate 102 is, for example, in the range of 400–725 microns. It should be noted that to facilitate description of the present invention, the semiconductor device structure is shown rotated 180 degrees in FIGS. 3–6, in comparison to FIGS. 1–2 (that is, the lower surface 106 is at the top of the FIGS. 3–6 rather than the bottom).

One skilled in the art will recognize that the semiconductor device structure 100 can be, for example, a semiconductor device structure in wafer form, an individual semiconductor device structure that has been diced (e.g., sawn) from a wafer, or a packaged semiconductor device structure. Moreover, such a packaged semiconductor device structure can be a semiconductor device structure that has been packaged using a flip-chip packaging technique.

Figure 4:
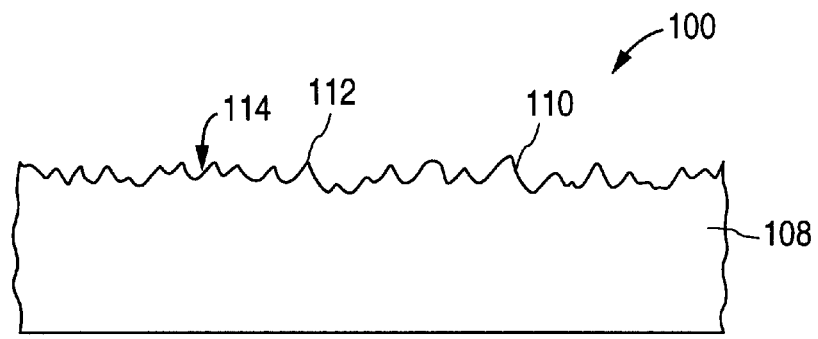

Next, the semiconductor substrate 102 is thinned by removing semiconductor material from the lower surface of the semiconductor substrate 102. The result is a thinned semiconductor substrate 108 with a backside surface 110, as illustrated in FIG. 4. The backside surface 110 has a characteristic surface roughness due to the presence of a plurality of peaks 112 and valleys 114. A typical thickness of the thinned semiconductor substrate 108 is, for example, in the range of 15 microns to 100 microns. The characteristic surface roughness (peak to valley) of the backside surface 110 is typically 100 angstroms or greater.

The semiconductor substrate 108 can be thinned using equipment and techniques that are well known in the art. For example, IC backside polishing or milling systems commercially available from Hamamatsu Photonics, Hamamatsu, Japan and from Hypervision, Fremont, Calif., USA can be used to thin the semiconductor substrate.

Figure 5:
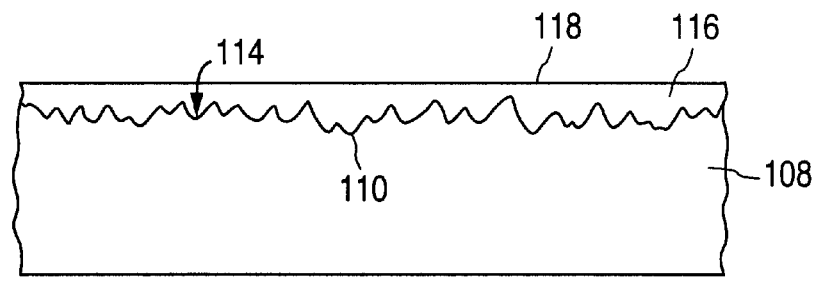

A backside surface fill material is then applied to the backside surface 110 of the thinned semiconductor substrate 108 to create a backside surface fill material layer 116 that at least partially fills the valleys 114 of the backside surface 110. The resultant structure is shown in FIG. 5. The backside surface fill material can be, for example, water, de-ionized (DI) water, an optical grade oil, an optical grade epoxy, an optical grade glass, or an organic material, such as an optically clear silicon rubber.

In order to further reduce scattering at the backside surface 110, it is preferred that the backside surface fill material have a refractive index that is closely matched to the refractive index of the semiconductor material. It is also desirable for the backside surface fill material to be non-attenuating for the radiation wavelengths of interest. It is also preferred, but not required, that the backside surface fill material be a liquid, in order to provide a liquid backside surface fill material layer 200 into which an objective lens 300 can be immersed (see FIG. 6). If an objective lens is not to be immersed in the backside surface fill material layer, then it is also preferred that the backside surface fill material layer should have a planar exposed surface 118 (see FIG. 5) that is less rough than the backside surface 110.

The thickness of the backside surface fill material layer 116 can be, for example, in the range of 100 angstroms to 30 microns. When, for example, an objective lens is to be immersed in the backside surface fill material layer, the thickness of the backside surface fill material layer should be equal to, or greater than, the focal distance of the objective lens (which is typically in the range of 20 microns to 30 microns). The backside surface fill material can be applied using any suitable technique, such as dipping, spraying or dispensing the backside surface fill material from a pipette.

Figure 6:
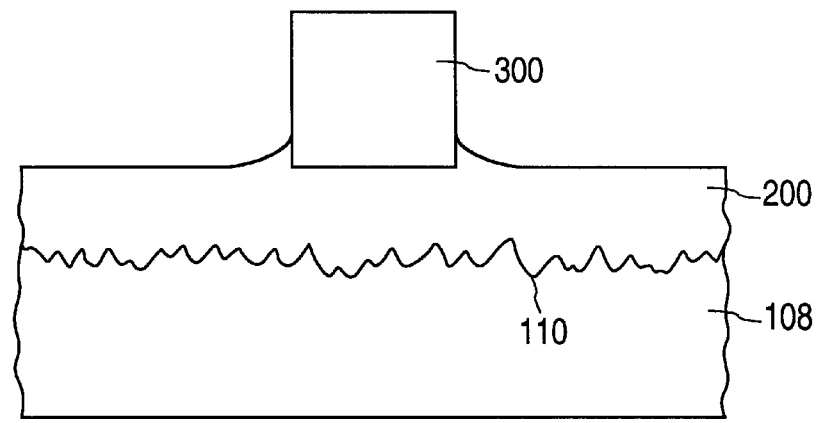
FIG. 6 is a cross-sectional view of a stage in a process according to the present invention, wherein an objective lens has been immersed in a backside surface fill material layer.

Next, an analytical imaging technique (e.g., photon emission microscopy techniques collecting radiation in the near IR wavelength region and voltage contrast analysis techniques) is performed by collecting radiation emitted through the backside surface 110. The performance of the analytical imaging technique can include the use of an objective lens that is immersed in the liquid backside surface fill material layer 200, as depicted in FIG. 6.

It is believed that in the processes according to the present invention will provide a reduction in radiation scattering in the range of 5:1 to 10:1 for the circumstance where the roughness of the backside surface of a thinned semiconductor substrate is 100 angstroms (peak-to-valley). For a backside surface roughness of 500 angstroms (peak to valley), the reduction in radiation scattering is believed to be approximately 100:1. Such reductions in radiation scattering result in a more accurate image being created during the performance of the analytical imaging technique.

The step of performing an analytical imaging technique by collecting radiation emitted through the backside surface can be conducted, for example, using photo emission microscope systems commercially available from Hamamatsu Photonics, Hamamatsu, Japan or other known analytical imaging techniques and equipment.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. An integrated circuit analytical imaging method, the method comprising:

providing a semiconductor device structure that includes a semiconductor having an integrated circuit formed in and on an upper surface of the semiconductor substrate;

thinning the semiconductor substrate by removing semiconductor material from a lower surface of the semiconductor substrate, thereby creating a thinned semiconductor substrate having a backside surface, the backside surface having a plurality of peaks and a plurality of valleys formed therein;

forming a backside surface fill material layer on the backside surface of the thinned semiconductor substrate, to at least partially fill the plurality of valleys; and performing an analytical imaging technique by collecting radiation emitted through the backside surface.

2. The method of claim 1, and wherein the forming step comprises applying a backside surface fill material that is a liquid.

3. The method of claim 1, and wherein the forming step comprises applying water as the backside surface fill material.

4. The method of claim 1, and wherein the forming step comprises applying an optical grade epoxy as the backside surface fill material.

5. The method of claim 1, and wherein the forming step comprises applying an organic material as the backside surface fill material.

6. The method of claim 1, and wherein the forming step comprises applying an optical grade glass as the backside surface fill material.

7. The method of claim 1, and wherein the semiconductor substrate comprises of silicon.

8. The method of claim 1, and wherein the performing step includes performing a voltage contrast analytical imaging technique.

9. The method of claim 1, and wherein the performing step includes performing a photon emission microscopic analytical imaging technique.

10. The method of claim 1, and wherein the performing step includes performing a photon emission microscopic analytical imaging technique using an immersion objective lens, during which the immersion objective lens is immersed in the backside surface fill material layer.

11. The method of claim 1, and wherein the forming step creates a backside surface fill material layer having a planar exposed surface.

12. An integrated circuit analytical imaging method, the method comprising:

providing a semiconductor device structure that includes a semiconductor substrate having an integrated circuit formed in and on an upper surface of the semiconductor substrate;

thinning the semiconductor substrate by removing semiconductor material from a lower surface of the semiconductor substrate, thereby creating a thinned semiconductor substrate having a backside surface, the backside surface having a plurality of peaks and a plurality of valleys formed therein;

applying an optical grade oil to the backside surface of the thinned semiconductor substrate, thereby creating optical grade oil layer that at least partially fills the plurality of valleys; and performing an analytical imaging technique by collecting radiation emitted through the backside surface.

13. An integrated circuit analytical imaging method, the method comprising:

providing a semiconductor device structure that includes a semiconductor substrate having an integrated circuit formed in and on an upper surface of the semiconductor substrate;

thinning the semiconductor substrate by removing semiconductor material from a lower surface of the semiconductor substrate, thereby creating a thinned semiconductor substrate having a backside surface, the backside surface having a plurality of peaks and a plurality of valleys formed therein;

applying a silicon rubber to the backside surface of the thinned semiconductor substrate, thereby creating a silicon rubber layer that at least partially fills the plurality of valleys; and performing an analytical imaging technique by collecting radiation emitted through the backside surface.

* * * * *